United States Patent [19]
Grondahl et al.

[11] Patent Number: 5,873,029
[45] Date of Patent: Feb. 16, 1999

[54] HIGH DYNAMIC RANGE MILLIMETER WAVE POWER DETECTOR WITH TEMPERATURE COMPENSATION

[75] Inventors: Christopher David Grondahl, Chandler; David Warren Corman; Kenneth Vern Buer, both of Gilbert, all of Ariz.

[73] Assignee: Motorola, Inc., Schaumburg, Ill.

[21] Appl. No.: 802,085

[22] Filed: Feb. 19, 1997

[51] Int. Cl.⁶ .................................................. H04B 1/04
[52] U.S. Cl. .................... 455/126; 455/127; 330/289; 330/278; 330/129; 327/513
[58] Field of Search .................... 455/126, 127, 455/115, 232.1, 234.1, 235.1, 239.1, 240.1, 245.1, 246.1; 330/289, 278, 129, 134, 279, 284; 327/83, 512, 513

[56] References Cited

U.S. PATENT DOCUMENTS

| | | |
|---|---|---|
| 3,612,912 | 10/1971 | Schwartz . |
| 4,282,515 | 8/1981 | Patterson, III . |
| 4,511,234 | 4/1985 | Andresen . |
| 4,742,565 | 5/1988 | Iwahashi ............................. 455/239.1 |
| 4,970,456 | 11/1990 | Holcomb et al. ........................ 324/95 |
| 4,996,500 | 2/1991 | Larson et al. ........................... 455/126 |
| 5,291,073 | 3/1994 | Lewandowski . |
| 5,365,279 | 11/1994 | Harford . |
| 5,410,271 | 4/1995 | Arbel . |
| 5,523,760 | 6/1996 | McEwan . |
| 5,524,285 | 6/1996 | Wray et al. ............................. 455/126 |
| 5,659,253 | 8/1997 | Busking .................................. 455/126 |

*Primary Examiner*—Doris H. To
*Attorney, Agent, or Firm*—Gregory J. Gorrie

[57] ABSTRACT

An RF power detector (10) includes an RF detector circuit (12), a nonlinear feedback amplifier (14), a temperature compensation circuit (16) and a linear feedback amplifier circuit (18). The RF detector circuit converts an RF signal to a voltage representative of the RF signals power level. Nonlinear feedback amplifier (14) nonlinearly amplifies the voltage and compensates for the nonlinearities of the RF detector circuits detector elements. Temperature compensation element provides a temperature compensation signal to compensate for the temperature effects of the detector elements of RF detector circuit (12). The output signal of RF power detector (10) is a substantially linearly representation of the RF input signals power level. Nonlinear feedback amplifier (14) includes a nonlinear feedback circuit (30) with a nonlinear feedback element (32) in the feedback path of op-amp (42). Power detection at microwave and millimeter wave frequencies is accomplished with the high dynamic range, high sensitivity, low minimum detection level and temperature sensitivity. The RF power detector is very producable and requires virtually no manual circuit tailoring or tuning.

13 Claims, 3 Drawing Sheets

HIGH DYNAMIC RANGE MILLIMETER WAVE POWER DETECTOR WITH TEMPERATURE COMPENSATION

FIELD OF THE INVENTION

This invention relates in general to the field of microwave circuits and in particular, microwave and millimeter-wave power detectors.

BACKGROUND OF THE INVENTION

In systems that transmit microwave signals, such as communication systems and radar systems, it is desirable to know the amount of energy being transmitted. Typically, power detectors are used to convert a microwave transmit signal to a voltage that represents that signal's energy level. These RF power detector circuits typically include a detector element, such as a detector diode, that is very non-linear with respect to the power level. The nonlinearity that results reduces the dynamic range of the power detector and results in a lower sensitivity for the power detector. Furthermore, these power detectors also, in general, tend to vary over temperature because of the temperature characteristics of the detector element. As a result, typical power detectors provide different output voltages for the same power level at different temperatures. In the radar and communication systems, the use of these typical RF detector circuits results in a voltage that is not necessarily representative of the output power transmitted. This problem is especially pronounced at high microwave frequencies, such as K-Band and other millimeter wave frequencies where it is especially important to conserve the amount of energy being used to transmit signals. Furthermore, any source of variation may cause substantial error in the transfer characteristics of such circuits.

Accordingly, what is needed is an RF power detector circuit that provides an increased dynamic range. What is also needed is an RF power detector circuit with higher sensitivity. What is also needed is an power detector circuit with improved temperature stability. What is also needed is a method and apparatus for providing power detection at microwave and millimeter wave frequencies with a higher dynamic range. What is also needed is a power detection apparatus with higher sensitivity and improved temperature stability. What is also needed is an RF power detector apparatus that compensates for the nonlinearities of the detector element suitable for use in a communication or radar system.

DETAILED DESCRIPTION OF THE DRAWINGS

The present invention providing, among other things, an RF power detector that comprises an RF detector circuit portion and a nonlinear feedback circuit that compensates, at least in part, for the nonlinearities of the RF detector circuit. The present invention also provides an RF detector that provides temperature compensation for the RF detector elements. Among other things, the present invention provides an improvement over typical RF power detectors by increasing the dynamic range through, in a preferred embodiment, the use of nonlinear feedback in a differential amplifier.

The present invention also provides, among other things, a method for providing a temperature compensated telemetry signal that represents a power level of a transmitted RF signal in a satellite transceiver. In the preferred embodiment, the method comprises the steps of providing a coupled version of the transmitted RF signal to a detector circuit. The method also comprises the step of converting the coupled version of the voltage and nonlinear amplifying the voltage in a nonlinear feedback amplifier circuit. The nonlinear amplifier circuit compensates, at least in part, for the nonlinearities of the detector elements of the detector circuit.

In a preferred embodiment, the present invention provides a method of detecting an RF power level. In this embodiment, the method includes the steps of converting an RF signal to a voltage in an RF detector circuit, wherein the voltage represents a power level of the RF signal, and non-linearly amplifying the voltage based at least in part on a temperature compensation signal. The non-linearly amplifying step is preferably performed by a non-linear feedback amplifier. The method also includes the step of providing the temperature compensation signal to the non-linear feedback amplifier by a temperature compensation circuit, such that the non-linearly amplifying step compensates at least in part for non-linear characteristics of the RF detector circuit.

Figure 1:
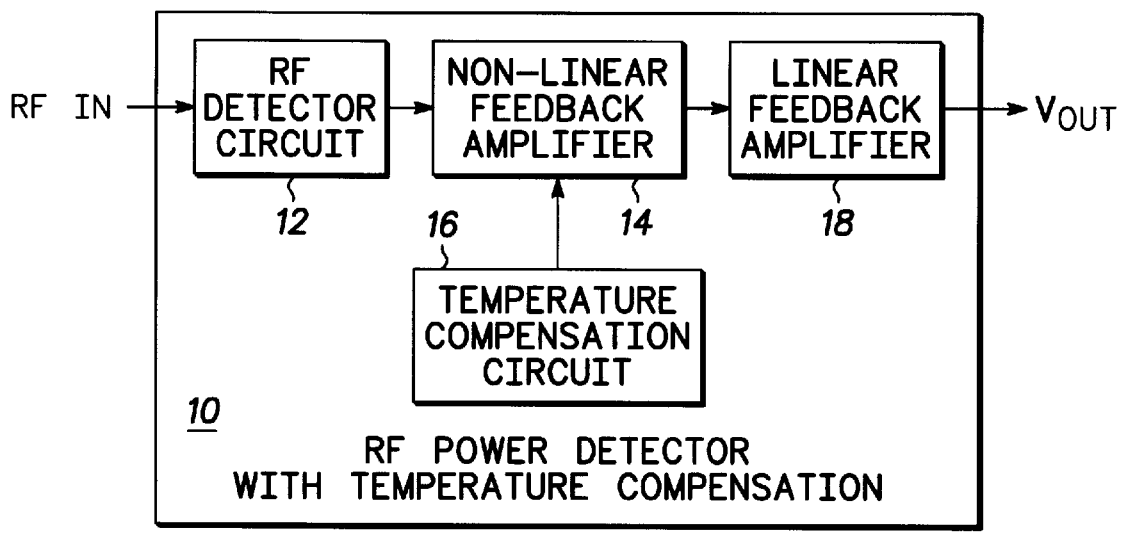
FIG. 1 shows an RF power detector with temperature compensation in accordance with a preferred embodiment of the preferred invention.

FIG. 1 illustrates an RF power detector with temperature compensation and nonlinear feedback in accordance with the preferred embodiment of the present invention. RF power detector 10 includes an RF detector circuit 12 for receiving an input RF signal. This input RF signal may be a coupled RF signal from a transmit path of a radar or other communication system. RF detector circuit converts the RF signal to a voltage representing that signal level. In general, the voltage is not a linear representation of the RF signal level. RF detector circuit 12 provides that voltage to non-linear feedback amplifier 14. Nonlinear feedback amplifier 14, nonlinearly amplifies the voltage from the RF detector circuit and provides an output voltage to linear feedback amplifier 18, which preferably linearly amplifies the voltage to provide an output signal. The output signal is preferably a substantially linearly representation of the RF input signal power level. RF power detector 10 also includes a temperature compensation circuit 16 which provides a temperature compensation signal to nonlinear feedback amplifier 14. Preferably, the temperature compensation signal compensates for the temperature characteristics of the detector elements in RF detector circuit 12. The nonlinear amplification performed by nonlinear feedback amplifier 14 preferably compensates for most of the nonlinear characteristics of the RF detector circuit 12. Accordingly, the output of RF power detector 10 is substantially, a linear representation of the power level of the input signal.

Figure 2:
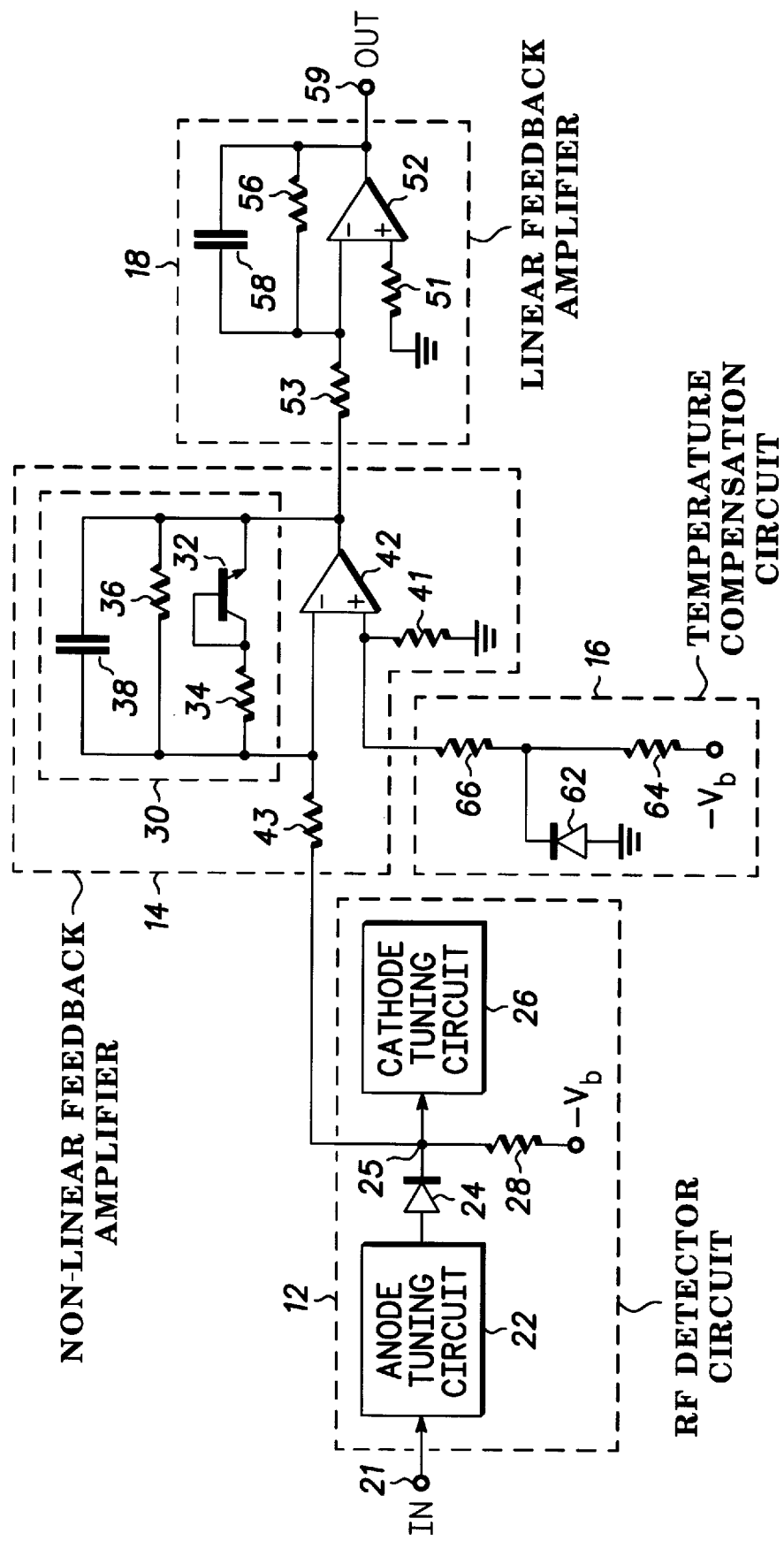
FIG. 2 illustrates a typical embodiment of the RF detector circuit with temperature compensation in accordance with a preferred embodiment of the present invention.

FIG. 2 illustrates an embodiment of RF power detector 10 with temperature compensation in accordance with a preferred embodiment of the present invention. RF detector circuit 12 includes an input 21 for receiving an input RF signal. The RF signal is preferably provided by a coupler, for example. In the embodiment shown, detector element 24 is shown as a detector diode for converting the RF signal to a voltage that represents that signal level. The RF detector circuit 12 includes anode tuning circuit 22 and cathode tuning circuit 26. In a preferred embodiment, the cathode tuning circuit is tuned to a short circuit at least at the RF frequencies of interest, while the anode tuning circuit is preferably impedance matched to 50 Ohms at low power levels to provide for a good minimum power detection level. A DC voltage is established at a node 25 through a diode bias through resistive element 28. In the embodiment shown in FIG. 2, resistive element 28 is preferably a pull-down resistor which biases a diode (e.g., detector element 24) at some voltage level.

The output of RF detector circuit 12 is provided to nonlinear feedback amplifier 14. This voltage is provided, preferably though resistive element 43 to an inverting input of a op-amp 42, which is part of a differential amplifier. The differential amplifier elements include capacitor 38, resistive elements 34, 36 and 43, nonlinear feedback element 32 and resistive element 41. In general, resistive elements 36 and 43 determine the gain of the nonlinear feedback circuit differential amplifier while capacitor 38 improves stability. Resistive element 34, helps determine the amount of nonlinearity provided by nonlinear feedback circuit 30. Nonlinear feedback element 32 is preferably a transistor connected as a diode (or may also be a diode) to provide the nonlinear feedback. Those of skill in the art will understand that other nonlinear feedback elements are also suitable.

Temperature compensation circuit 16 provides a temperature compensation signal to the non-inverting input of op-amp 42 of nonlinear feedback amplifier 14. A reference element 62, preferably has similar or identical temperature characteristics as that of detector element 24 of RF detector circuit 12. Resistive element 64 provides a bias level voltage to bias the reference element 62. In the preferred embodiment, reference element 62 is a diode identical to detector element 24.

Reference element 62 provides a temperature compensation signal through resistive element 66 and 41 to the non-inverting input of op-amp 42. Accordingly, when reference element 62 is biased properly, a reference voltage is provided to the differential amplifier that has substantially similar temperature characteristics as the signal from the RF detector circuit. Therefore, temperature stability of the RF power detector 10 is enhanced.

RF power detector 10 also includes linear amplifier circuit 18 for linearly amplifying the output of nonlinear feedback amplifier 14. Circuit 18 preferably includes resistive elements 53 and 56 for determining the gain of circuit 18, and an op-amp 52 with resistive element 51 coupling the non-inverting input of op-amp 52 to ground. Circuit 18 also includes a capacitive element or capacitor 58 in a feedback path for improving stability of linear amplifier circuit 18. Accordingly, circuit 18 provides voltage inversion and additional voltage gain as desired. Circuit 18 preferably provides an output voltage that is substantially a linear function of its input voltage.

Nonlinear feedback amplifier 14 through the use of nonlinear feedback circuit 30 and temperature compensation circuit 16 increases the dynamic range of RF power detector 10 by providing voltage gain for increased sensitivity and by constraining high level signals with the use of nonlinear feedback. Voltage gain at low signal levels increases sensitivity (i.e., the change in output voltage per change in input power). At high RF power levels less voltage gain is needed because the RF detector elements are inherently more sensitive in high power levels. Accordingly, nonlinear feedback amplifier 14 provides more gain at lower power levels and less gain at high power levels. Accordingly, the dynamic range and sensitivity of RF power detector 10 is increased.

Those of skill in the art will understand how to select the appropriate resistors, diodes, transistors and capacitors for the desirable performance and frequency range of their application. Resistive element 34 is selected such that the nonlinear feedback does not overcompensate for the detectors nonlinearities so that each voltage level represents a unique power level.

Figure 3:
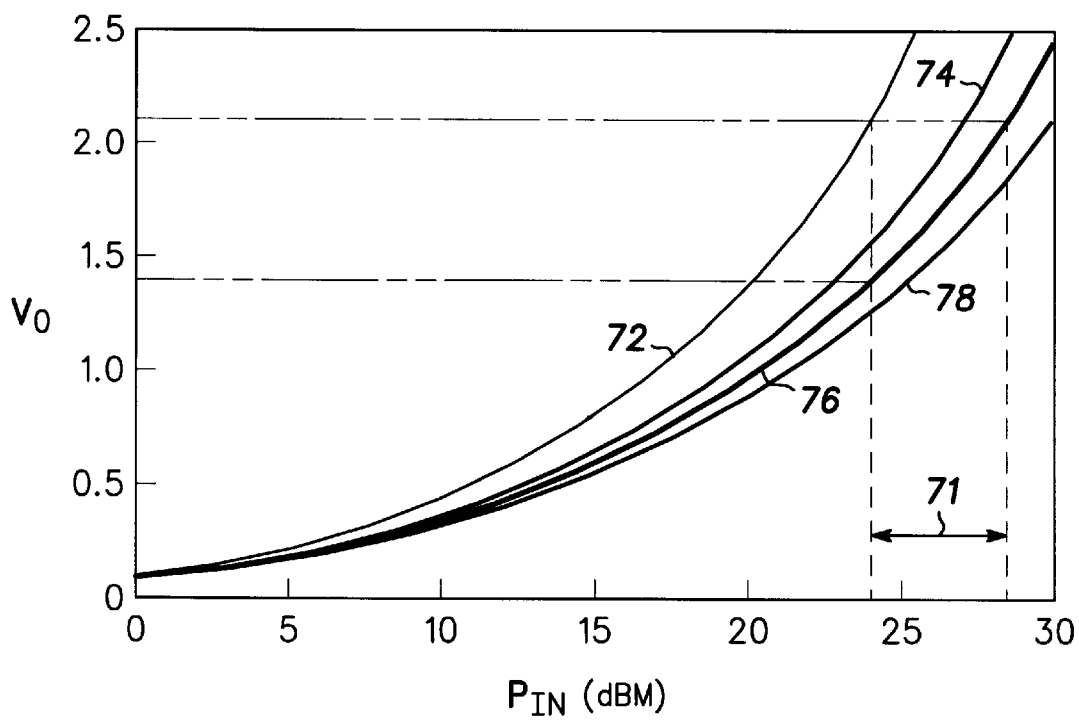
FIG. 3 is a graph comparing the performance of an RF power detector circuit in accordance with a preferred embodiment of the present invention with typical RF power detector circuits.

FIG. 3 is a graph comparing the performance of an RF power detector circuit in accordance with a preferred embodiment of the present invention with typical RF power detector circuits. The performance of an RF power detector circuit without temperature compensation and without nonlinear feedback is also shown. Output voltage is shown on the Y-axis while input power level (in dBm) is shown on the X-axis. Graph 72 shows the output voltage of a RF power detector without nonlinear feedback at room temperature. Graph 72 may represent an RF detector circuit similar to RF detector circuit 12 of FIG. 1.

Graph 76 illustrates an RF detector circuit similar to RF detector circuit 12 of FIG. 1 with a nonlinear feedback amplifier circuit such as nonlinear feedback amplifier 14. Line 71 shows that the dynamic range is increased by approximate 5 dB at room temperature through the use of a nonlinear feedback circuit. In the preferred embodiment, RF power detector 10 is set for minimum sensitivity of approximately 20 milli-Volts per dB and a maximum output voltage of approximately 1.85 Volts.

Temperature compensation circuit 16, when included in RF power detector 10, preferably compensates for the temperature variation of the detector elements in RF detector circuit 12. For example, graphs 74 and 78 show the respective hot and cold performance of a RF power detector circuit such as RF power detector 10. The cold data typically represents performance at approximately −40° C. while the hot temperature would typically represent date at +25° C. As a result, a temperature sensitivity of less than 2.7 milli-Volts per degrees Celsius is achieved.

As a result of the improved sensitivity and improved dynamic range, RF power detector 10 is more producable than typical power detectors because less manual circuit tuning is required for good performance over a large dynamic range.

Figure 4:
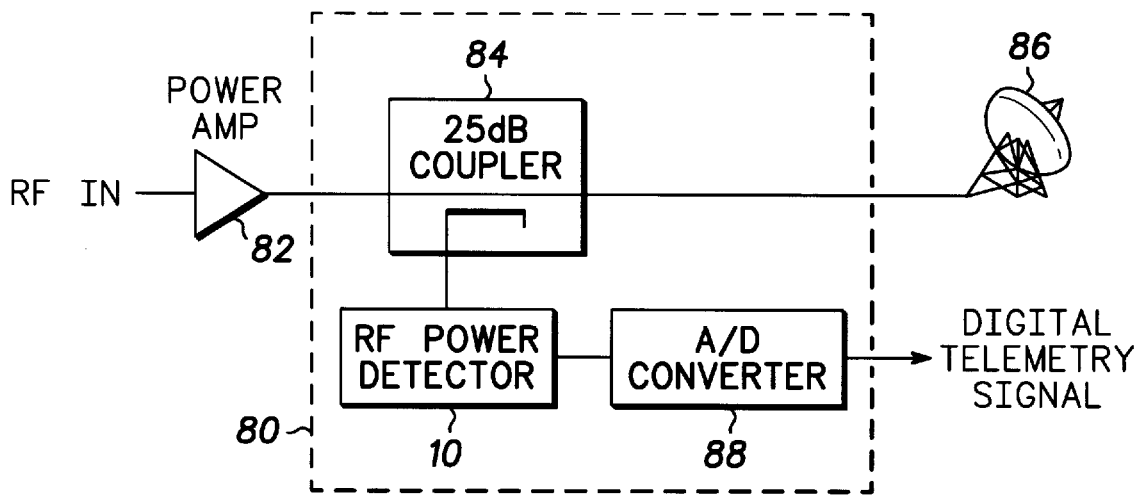
FIG. 4 illustrates a circuit for providing a digital telemetry signal in accordance with a preferred embodiment of the present invention.

FIG. 4 is illustrates digital telemetry circuit in accordance with the preferred embodiment of the present invention. A power amplifier 82 amplifies an RF signal that is to be transmitted by an antenna, such as satellite transmit antenna 86. The RF signal may be any RF communication or radar signal, and is preferably a millimeter or microwave signal. Telemetry circuit 80 includes a coupler element 84 for providing a coupled RF signal to RF power detector 10. Desirably the coupled RF signal is a linear representation of the transmitted RF signal and provides the same amount of coupling independent of RF power level. For example a 25 dB microstrip coupler is preferably used. The coupled RF signal is provided to RF power detector 10 where it is converted to a voltage which is desirably a linear representation of the RF power signal level of the coupled signal. RF power detector 10 is desirably similar to the RF power detector 10 of FIGS. 1 and 2.

Telemetry circuit preferably includes an analog to digital (A/D) converter 88 for converting the output voltage of RF power detector 10 to a digital telemetry signal. The digital telemetry signal is a digital representation of the RF signal being transmitted. This digital telemetry signal may be used by a satellite or a satellite ground station or may be used by a radar system in many different ways. Typically, A/D converter 88 is provided a voltage of no more than 3 volts and converts that voltage to a digital signal, preferably to either 8 or 16 bits of information. Those of skill in the art that depending on the specific application, digital telemetry circuit 80 may include different types of couplers and detectors, converters and power amplifiers.

In summary, the present invention provides an RF detector that comprises an RF detector circuit for converting an RF signal to a voltage that represents the power level of an RF signal. In the preferred embodiments, the RF power detector includes a nonlinear feedback amplifier for nonlinearly amplifying the voltage based on the temperature compensation signal and a temperature compensation circuit for providing temperature compensation. Desirably, a nonlinear feedback amplifier compensates at least in part for the nonlinear characteristics of the RF detector circuit. Accordingly, dynamic range is increased, and sensitivity is improved.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. An RF power detector comprising:
    an RF detector circuit for converting an RF signal to a voltage representing a power level of said RF signal, said voltage and said power level having a non-linear relationship;
    a non-linear feedback amplifier that includes a non-linear feedback element, said non-linear feedback amplifier for non-linearly amplifying said voltage based at least in part on a temperature compensation signal and an amount of non-linear feedback from said non-linear feedback element; and
    a temperature compensation circuit for providing said temperature compensation signal to said non-linear feedback amplifier,
    wherein non-linear feedback element causes said non-linear feedback amplifier to compensate at least in part for said non-linear relationship of said RF detector circuit, said non-linear feedback element comprising a diode in series with a resistive element, said resistive element controlling said amount of nonlinear feedback to said non-linear feedback amplifier.

2. The RF power detector as claimed claim 1 wherein said non-linear feedback amplifier provides an output signal, and wherein the RF power detector further comprises an analog to digital converter for converting said non-linearly amplified output signal to a digital signal representing said power level.

3. An RF power detector comprising:
    an RF detector circuit for converting an RF signal to a voltage representing a power level of said RF signal;
    a non-linear feedback amplifier for non-linearly amplifying said voltage based at least in part on a temperature compensation signal; and
    a temperature compensation circuit for providing said temperature compensation signal to said non-linear feedback amplifier,
    wherein said non-linear feedback amplifier compensates at least in part for non-linear characteristics of said RF detector circuit, and
    wherein said non-linear feedback amplifier includes a differential amplifier having an inverting and a non-inverting input, said temperature compensation signal being provided to said non-inverting input, said voltage being provided to said inverting input,
    and wherein said non-linear feedback amplifier also includes a non-linear feedback circuit for providing non-linear feedback signals from an output of said differential amplifier to said inverting input,
    and wherein said non-linear feedback circuit comprises:
    a non-linear element in series with a first resistive element coupled between said output and said inverting input;
    a second resistive element coupled in parallel with said non-linear element and said first resistive element; and
    a capacitive element coupled in parallel with said non-linear element and said first resistive element,
    said non-linear feedback circuit compensating at least in part for said nonlinear characteristics of said RF detector circuit.

4. The RF power detector as claimed in claim 3 wherein said RF detector circuit further comprises a nonlinear detector element for non-linearly converting said RF signal to said voltage, said non-linear characteristics of said RF detector circuit being caused by said detector element.

5. The RF power detector as claimed in claim 4 wherein said detector element has temperature characteristics causing said voltage to vary with temperature, and
    wherein said temperature compensation circuit includes a reference element for providing said temperature compensation signal to said non-inverting input of said differential amplifier, said temperature compensation signal providing compensation for said temperature characteristics of said detector element.

6. The RF power detector as claimed in claim 5 wherein said reference element and said detector element having substantially identical temperature characteristics.

7. The RF power detector as claimed in claim 3 wherein said non-linear feedback amplifier provides an output signal that is a temperature compensated and substantially linear representation of said power level,
    and wherein the RF power detector further comprises a linear feedback amplifier for inverting and linearly amplifying said output signal to provide an inverted output signal.

8. The RF power detector as claimed in claim 7 wherein said detector element is a detector diode, and said reference element is a reference diode, and
    wherein said RF detector circuit further comprises:
    an anode tuning circuit for providing a match to a fifty ohm impedance at low power levels, said anode tuning circuit for coupling an anode side of said detector diode with an RF signal path; and
    a cathode tuning circuit for providing an RF short circuit on a cathode side of said detector diode, said cathode side coupled through a third resistive element to said inverting input of said differential amplifier.

9. The RF power detector as claimed in claim 8 wherein said temperature compensation circuit further includes a fourth resistive element coupling said reference diode to said non-inverting input of said differential amplifier, and wherein said reference diode is biased so as to provide said temperature compensation signal having similar temperature characteristics to said temperature characteristics of said detector diode.

10. A method of detecting an RF power level comprising the steps of:

converting an RF signal to a voltage in an RF detector circuit, said voltage representing a power level of said RF signal;

non-linearly amplifying said voltage based at least in part on a temperature compensation signal and a feedback signal, said non-linearly amplifying step being performed by a non-linear feedback amplifier;

providing said temperature compensation signal to said non-linear feedback amplifier by a temperature compensation circuit;

providing said feedback signal to the non-linear feedback amplifier with a diode in series with a resistive element, said resistive element controlling an amount of non-linear feedback to said non-linear feedback amplifier, wherein the feedback signal provided to said non-linear feedback amplifier compensates at least in part for non-linear characteristics of said RF detector circuit said non-linear feedback amplifier providing an output signal that is a temperature compensated and substantially linear representation of said power level; and inverting and linearly amplifying in a linear feedback amplifier, said output signal to provide an inverted output signal.

11. A method of providing a temperature compensated digital telemetry signal representing a power level of a transmitted RF signal in a satellite transceiver comprising the steps of:

providing a coupled version of said transmitted RF signal to a detector circuit;

converting coupled version to a voltage in an RF detector circuit, said voltage representing said power level, said voltage and said power level having a non-linear relationship;

non-linearly amplifying said voltage based at least in part on a temperature compensation signal and an amount of non-linear feedback provided by a non-linear feedback element, said non-linearly amplifying step being performed by a non-linear feedback amplifier that includes said non-linear feedback element, said non-linear feedback element comprising a diode in series with a resistive element, said resistive element controlling said amount of non-linear feedback to said non-linear feedback amplifier;

providing said temperature compensation signal to said non-linear feedback amplifier by a temperature compensation circuit, wherein the non-linear feedback element causes said non-linear feedback amplifier to compensate at least in part for non-linear characteristics of said RF detector circuit based on said amount of non-linear feedback; and converting said non-linearly amplified voltage to said digital telemetry signal in an analog to digital converter.

12. A method of providing a temperature compensated digital telemetry signal representing a power level of a transmitted RF signal in a satellite transceiver comprising the steps of:

providing a coupled version of said transmitted RF signal to a detector circuit;

converting coupled version to a voltage in an RF detector circuit, said voltage representing said power level;

non-linearly amplifying said voltage based at least in part on a temperature compensation signal and an amount of non-linear feedback provided by a non-linear feedback element to provide a non-linearly amplified voltage, said non-linearly amplifying step being performed by a non-linear feedback amplifier, said non-linear feedback element comprising a diode in series with a resistive element, said resistive element controlling said amount of non-linear feedback to said non-linear feedback amplifier;

providing said temperature compensation signal to said non-linear feedback amplifier by a temperature compensation circuit, wherein the non-linearly amplifying step compensates at least in part for non-linear characteristics of said RF detector circuit based on said amount of non-linear feedback;

converting said non-linearly amplified voltage to said digital telemetry signal in an analog to digital converter;

said non-linear feedback amplifier providing an output signal that is a temperature compensated and substantially linear representation of said power level;

inverting and linearly amplifying in a linear feedback amplifier, said output signal to provide an inverted output signal.

13. The method as claimed in claim 12 wherein the providing, converting, non-linearly amplifying and converting steps are performed on a satellite, and wherein the method further comprises the step of sending said digital telemetry signal to a satellite control facility.

* * * * *